(12) United States Patent
Ganther, Jr. et al.

(10) Patent No.: US 6,448,767 B1
(45) Date of Patent: Sep. 10, 2002

(54) FAST FLUX LOCKED LOOP

(75) Inventors: Kenneth R. Ganther, Jr., Olathe, KS (US); Lowell D. Snapp, Independence, MO (US)

(73) Assignee: Honeywell International, Inc., Morris County, NJ (US)

( * ) Notice: Subject to any disclaimer, the term of this patent is extended or adjusted under 35 U.S.C. 154(b) by 175 days.

(21) Appl. No.: 09/596,135

(22) Filed: Jun. 16, 2000

(51) Int. Cl.[7] .............................................. G01R 33/035
(52) U.S. Cl. ...................................... 324/248; 327/527
(58) Field of Search ..................... 324/248; 505/845, 505/846; 327/527

(56) References Cited

U.S. PATENT DOCUMENTS

| | | | |
|---|---|---|---|
| 4,004,217 A | | 1/1977 | Giffard |
| 4,389,612 A | | 6/1983 | Simmonds et al. |
| 4,851,776 A | | 7/1989 | Goto et al. |
| 5,095,270 A | | 3/1992 | Ludeke |
| 5,173,659 A | | 12/1992 | Chiba et al. |
| 5,231,353 A | | 7/1993 | Nakayama et al. |
| 5,387,864 A | * | 2/1995 | Gershenson et al. ........ 324/248 |
| 5,532,592 A | | 7/1996 | Colclough |

OTHER PUBLICATIONS

Clarke, J., SQUID Sensors: Fundamentals, Fabrication and Applications, H. Weinstock ed., Kluwer Academic Press, Dordrecht, 1996, pp. 1–62.

Drung, D., Advanced SQUID Read–Out Electronics in SQUID Sensors: Fundamentals, Fabrication and Applications, H. Weinstock, ed., Kluwer Academic Press, Dordrecht, 1996, pp. 63–116.

Kung, P.J., Bracht, R.R., Flynn, E.R., Lewis, P.S., A direct current superconducting quantum interference device gradiometer with a digital signal processor controlled flux–locked loop and comparison with a conventional analog feedback scheme, Rev. Sci. Instrum. 57 (1), Jan. 1996, pp. 222–229.

Kraus Jr., R.H., Bracht, R., Flynn, E.R., Jia, Qu., Maas, P., Reagor, D., and Stettler, M., A digital flux–locked loop for high temperature SQUID magnetometer and gradiometer systems with field cancellation, to be published.

Wellstood, F., Heiden, C., and Clarke, J., Integrated dc SQUID magnetometer with a high slew rate, Rev. Sci. Instrum. 55 (6), Jun. 1984, pp. 952–957.

Matlashov, A., Kraus, Jr., R.H., Espy, M., Ruminer, P., Atencio, L., Garachtchenko, A., Sequential Read–Out Architecture for Multi–Channel SQUID systems, IEEE Transactions on Applied Superconductivity, vol. 9, No. 2, Jun. 1999, pp. 3672–3675.

Ruthroff, C.L., Some Borad–Band Transformers, Proceedings of the IRE, Aug. 1959, pp. 1337–1342.

* cited by examiner

Primary Examiner—Walter E. Snow
(74) Attorney, Agent, or Firm—Hovey Williams LLP

(57) ABSTRACT

A flux locked loop for providing an electrical feedback signal, the flux locked loop employing radio-frequency components and technology to extend the flux modulation frequency and tracking loop bandwidth. The flux locked loop of the present invention has particularly useful application in read-out electronics for DC SQUID magnetic measurement systems, in which case the electrical signal output by the flux locked loop represents an unknown magnetic flux applied to the DC SQUID.

30 Claims, 2 Drawing Sheets

FAST FLUX LOCKED LOOP

RELATED APPLICATIONS

This application is related to a co-pending patent application entitled "Read-Out Electronics for DC SQUID Magnetic Measurements", Ser. No. 09/596,190, filed Jun. 16, 2000, and a co-pending patent application entitled "Frequency Multiplexed Flux Locked Loop Architecture for Multi-Channel DC SQUID Systems", Ser. No. 09/596,137, filed Jun. 16, 2000, both of which are hereby incorporated into the present invention by reference.

FEDERALLY SPONSORED RESEARCH OR DEVELOPMENT

The U.S. government has a paid-up license in this invention and the right in limited circumstances to require the patent owner to license others on reasonable terms as provided for by the terms of contract No. DE-AC04-76-DP00613 awarded by the United States Department of Energy.

BACKGROUND OF THE INVENTION

1. Field of the Invention

The present invention relates to electronic circuits and signals, and, more particularly, to flux locked loops for providing feedback signals, including feedback signals to direct current superconducting quantum interference devices (DC SQUIDs).

2. Description of the Prior Art

Flux locked loops are typically used in the read-out electronics of magnetic measurement systems employing DC SQUIDs. DC SQUIDs are small, cryogenically-cooled magnetic sensors that comprise a ring of superconducting material interrupted by two Josephson junctions. DC SQUIDs are designed to detect changes in magnetic flux and can be used as flux-to-voltage converters. The standard read-out method for DC SQUID measurements is to inject a magnetic field modulation signal into the DC SQUID and then, using a flux locked loop (FLL) circuit, sense changes in the modulating signal due to external magnetic fields. The FLL provides negative feedback to the DC SQUID in order to maintain linear operation and a stable operating point at the DC SQUID. This negative feedback precisely counteracts the externally applied magnetic field, provided the slew rate and dynamic range of the DC SQUID and FLL are not exceeded. Measurements of the external magnetic flux can be made by measuring this feedback signal which is an identical image of the external magnetic flux signal detected by the pick-up coil of the DC SQUID sensor within the tracking bandwidth of the FLL.

DC SQUID sensor systems for non-destructive testing/evaluation or for biomagnetic measurements are not yet practical for use in a field setting (i.e., environments containing high levels of magnetic interference). The art has been limited to a flux modulation frequency of approximately 500 KHz with a maximum tracking loop bandwidth of 250 KHz. These limitations result in the FLL losing lock when exposed to large amplitude or high slew rate external stray magnetic fields from 50/60 Hz AC power lines, AM broadcast transmitters, small changes in the Earth's magnetic field, and other sources present in unshielded environments. When the FLL loses lock, any measurement in progress is invalidated.

SUMMARY OF THE INVENTION

The FLL of the present invention includes essential enabling technology which makes the operation of DC SQUIDs practical in unshielded environments by alleviating the effects of high levels of magnetic interference on DC SQUID measurements, and improving FLL performance by a factor of at least ten. This is accomplished in part by implementing the FLL with analog and radio-frequency (RF) components. The use of RF techniques is based on an RF analysis of the DC SQUID transfer function. Detailed RF analysis of the signal output from a DC SQUID coupled to a traditional flux locked loop using square wave modulation reveals the signal output to be in the form of double sideband suppressed carrier (DSB-SC) modulation products centered at the modulation frequency and occupying twice the bandwidth of the baseband signal. The use of RF techniques results in a flux modulation frequency of at least 33 MHz and a maximum tracking loop bandwidth of at least 5 MHz. The FLL is thus able to track, without unlocking, undesired high slew rate magnetic interference, thereby eliminating the need for expensive and restrictive magnetic shielding for the DC SQUID.

These and other important aspects of the present invention are more fully described in the section entitled Detailed Description, below.

BRIEF DESCRIPTION OF THE DRAWINGS

A preferred embodiment of the present invention is described in detail below with reference to the attached drawing figures, wherein.

DETAILED DESCRIPTION OF THE PREFERRED EMBODIMENT

Figure 1:
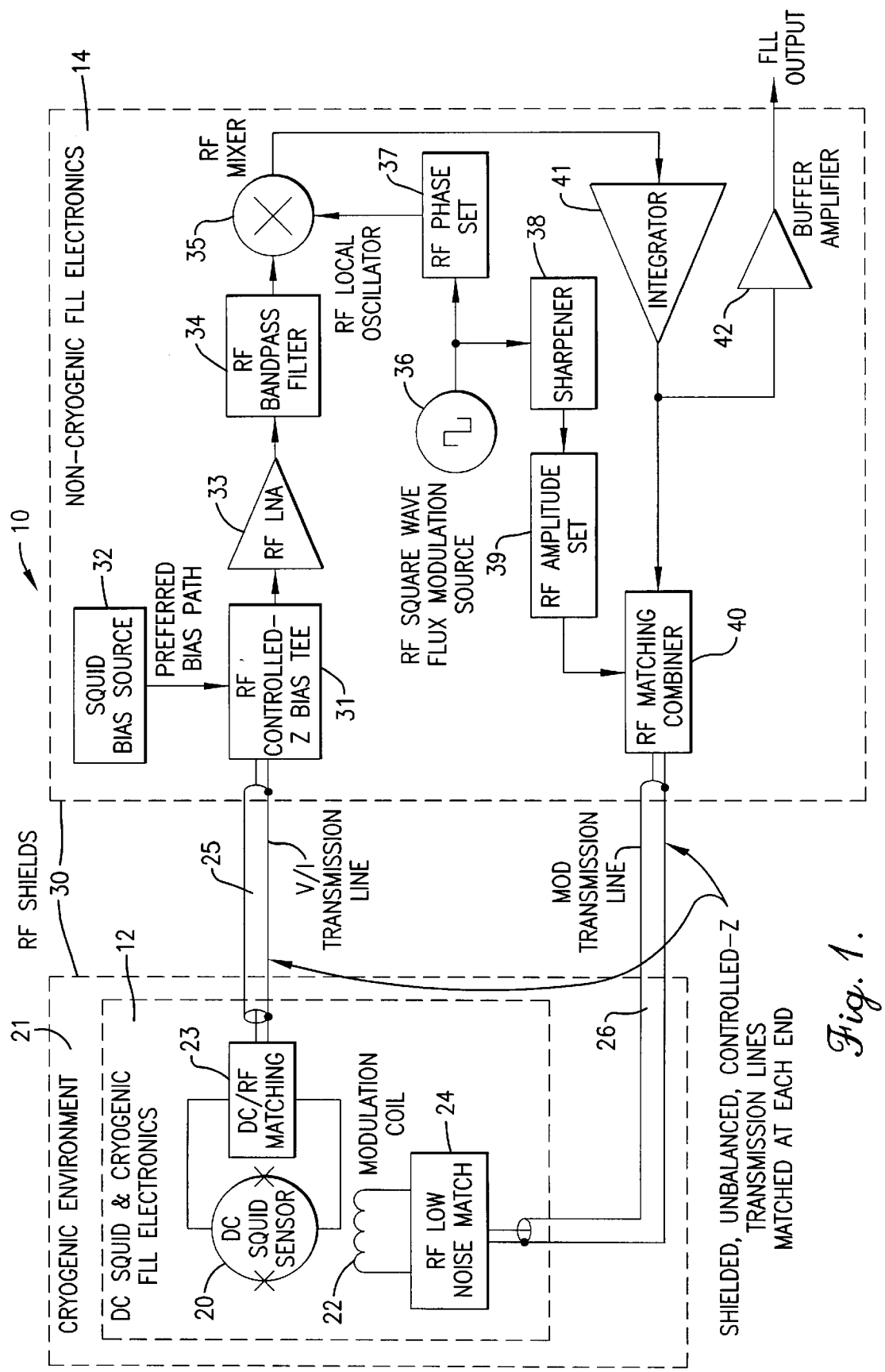
FIG. 1 is a block diagram illustrating a flux locked loop constructed in accordance with a preferred embodiment of the present invention.

Referring to FIG. 1, a DC SQUID flux locked loop feedback system 10 is shown comprising a DC SQUID with cryogenic flux locked loop electronics 12 and non-cryogenic flux locked loop electronics 14. Such a DC SQUID feedback system 10 is a major component of read-out electronics for a DC SQUID magnetic measurement system, as described and shown in the copending patent application entitled "Read-Out Electronics for DC SQUID Magnetic Measurements", Ser. No. 09/596,190, filed Jun. 16, 2000. The DC SQUID with cryogenic flux locked loop electronics 12 comprises a DC SQUID sensor 20; a cryogenic environment 21; a modulation coil 22; a DC/RF matching circuit 23; a low noise matching circuit 24; and upper and lower transmission lines 25,26. The cryogenic environment 21 may include an enclosure 30 which is shielded from radio-frequency signals. The DC SQUID sensor 20, cryogenic environment 21, and modulation coil 22 are well-known in the art.

Referring to FIG. 1, an upper transmission line 25 and a lower transmission line 26 couple the cryogenic electronics 12 to the non-cryogenic electronics 14. Specifically, the upper transmission line 25 extends between and connects the DC/RF matching circuit 23 and the controlled impedance bias tee 31. The lower transmission line 26 extends between and connects the low noise matching circuit 24 and the matching combiner circuit 40. The upper and lower transmission lines 25,26 are preferably shielded, unbalanced, and matched at each end. Shielded transmission lines allow the flux locked loop 10 to be operated at much higher modulation frequencies with correspondingly higher tracking bandwidths. In the preferred embodiment, coaxial cable is used for the upper and lower transmission lines 25,26. Greater thermal losses associated with coaxial cable when immersed in the cryogenic environment 21 may be mitigated by the use of special cryogenic coaxial cables, such as coaxial cables jacketed with stainless steel. Potential outgassing associated with coaxial cable use in a vacuum can be mitigated by various methods, including proper cable selection, use of PTFE (Teflon) insulation, etc. Other types of transmission line, such as stripline, can be used in place of coaxial cable. Furthermore, the upper and lower transmission lines 25,26 can be of any characteristic impedance, including 50 Ohms, which is RF industry standard and used in the preferred embodiment of the read-out electronics of the present invention. By using upper and lower transmission lines 25,26 which are shielded from RF interference, the entire flux locked loop 10 can, at the discretion of the user, be fully RF shielded all the way to and including the cryogenic electronics 12. Magnetic fields of interest can penetrate this RF shield.

Referring to FIG. 1, a DC/RF matching circuit 23 is shown which comprises a cold broadband RF transformer 55 (see FIG. 2) with an added radio-frequency capacitor 56 so that, at RF frequencies, the transformer converts the low impedance of the DC SQUID sensor 20 to the characteristic impedance of the upper transmission line 25 and the RF low noise amplifier 33 and, at DC, the transformer is a through-line short circuit that allows DC bias current to pass via the upper transmission line 25 to the DC SQUID sensor 20. The DC/RF matching circuit 23 is located in the cryogenic environment 21 at the DC SQUID sensor 20 so that the temperature of the DC/RF matching circuit 23 is also cryogenic, thereby lowering the Johnson noise of the DC/RF matching circuit's resistors to a very low level.

Figure 2:
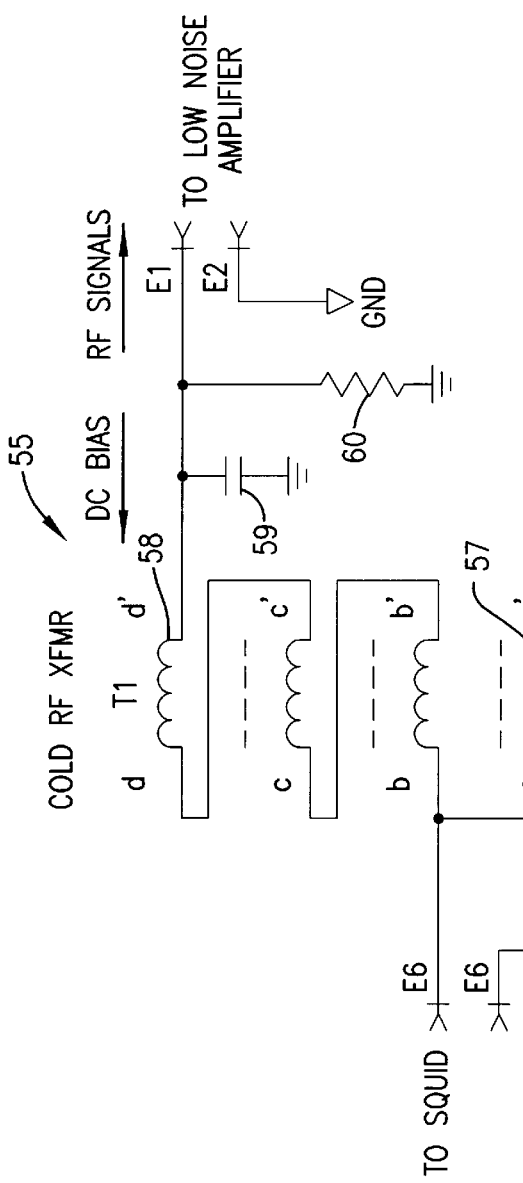
FIG. 2 is a circuit schematic illustrating a preferred embodiment of the cold RF transformer component of the present invention.

Referring specifically to FIG. 2, the cold RF transformer 55 of the DC/RF matching circuit 23 (see FIG. 1) is a unique radio-frequency broadband ferrite-cored cold transformer used to match the very low impedance of the DC SQUID sensor 20 to the unbalanced upper transmission line 25 (see FIG. 1). The cold RF transformer 55 is a modified Ruthroff design which allows the DC bias current to pass through. the transformer 55 to the DC SQUID sensor 20 without distorting the RF impedance matching characteristics of the transformer 55.

The cold RF transformer 55 is a broadband device that passes not only the RF flux modulation frequency but also both sideband signals that are formed by the DC SQUID modulation process that transforms magnetic field signals into voltages. The bandwidth of the cold RF transformer 55 is, as a minimum, at least twice the tracking bandwidth of the flux locked loop 10 as a whole. A 10,000 pF capacitor 56 is inserted between the a' and b windings of the transformer 55 to block the DC bias current from being shorted to ground. A 30 pF capacitor 59 is included to stretch the transformer's bandwidth beyond four octaves; and a 150 Ohm resistor 60 is included in order to achieve the best return loss.

A transformer having the following characteristics allows for a flux modulation frequency of 33 MHz while matching a 3.1 Ohm DC SQUID to a 50 Ohm unbalanced transmission line: a bandwidth of from 3.44 MHz to 99 MHz; an insertion loss less than 0.1 dB; an impedance ratio of 1:16; a return loss of 20 dB at 33 MHz (using a high temperature DC SQUID); a core constructed from Micrometals: BLN 1728-8; one turn of #36 AWG quifilar wound wire; a pitch of 20 turns per inch; and a capacitor of 0.01 uF. For RF flux modulation frequencies up to approximately 300 MHz, an unbalanced source/unbalanced load (UNUN) design employing a ferrite core may be used. For frequencies above 300 MHz, the UNUN design may be implemented using stripline techniques.

The primary side of the cold RF transformer 55 is connected to the DC SQUID sensor 20 as an unbalanced source, with one side of the DC SQUID sensor ring as the bias terminal and the other side connected to ground. The secondary side of the cold RF transformer 55 is connected to the center conductor of the unbalanced upper transmission line 25. The load on the transformer's secondary is the low noise amplifier 33 (see FIG. 1). Thus, the RF signal from the DC SQUID sensor 20 passes through the capacitor 56 into the primary winding 57 of the transformer 55, out the secondary 58 side of the transformer 55, and through the unbalanced upper transmission line 25, and on to the room temperature bias tee 31 and low noise amplifier 33 (see FIG. 1).

Referring to FIG. 1, the flux modulation signal on the lower transmission line 26 feeds a low noise matching circuit 24 comprising a simple series/shunt resistor combination that greatly reduces the Johnson noise injected into the flux modulation coil 22 at the DC SQUID sensor 20 and simultaneously terminates the lower transmission line 26 in the characteristic impedance of the lower transmission line 26.

It may be preferable in some applications to eliminate the DC/RF matching circuit 23 and the low noise matching circuit 24 from the present invention, as is the case in the copending patent application entitled "Frequency Multiplexed Read-out Architecture for Multi-Channel SQUID Systems", Ser. No. 09/596,137, filed on Jun. 16, 2000. Eliminating the matching circuits 23,24 will not affect signal fidelity, but will result in some loss in noise performance. If the DC/RF matching circuit 23 and the low noise matching circuit 24 are eliminated then the upper and lower transmission lines 25,26 should be matched at only one end, either the source or the load, whichever is at the higher temperature (i.e., not cryogenic).

The non-cryogenic flux locked loop electronics 14 provide negative feed back to the DC SQUID sensor 20 in order to keep the sensor 20 i n linear operation and at a stable operating point. This feedback is proportional to the change in the magnetic filed linked with the DC SQUID sensor 20, provided that the dynamic range and slew rate of the sensor 20 and flux locked loop electronics 12,14 are not exceeded. The non-cryogenic electronics 14, being preferably housed in an enclosure 30 which is shielded from radio-frequency signals, comprises eleven major components: a controlled impedance RF bias tee 31; at least one bias source 32; at least one RF low noise amplifier 33; an RF bandpass filter 34; an RF mixer 35; an RF square wave flux modulation source 36; an RF phase setting circuit 37; a sharpener circuit 38; an RF amplitude setting circuit 39; an RF matching combiner circuit 40; an integrator 41; and a buffer amplifier 42.

The controlled-impedance bias tee 31 injects DC current from the bias source 32 to feed the DC SQUID sensor 20, and blocks the DC current from entering the RF low noise amplifier 33 without disturbing the matching characteristics over the frequency band of interest. Furthermore, the controlled-impedance bias tee 31 allows the DC bias current to be sent down the same Upper transmission lines 25 as are used for extracting the output signal from the DC SQUID sensor 20.

The RF low noise amplifier 33 amplifies the signal which originated from the DC SQUID sensor 20. Because the information of interest is in the form of DSB-SC modulation products, as discussed in the section entitled SUMMARY OF THE INVENTION, above, RF gain and synchronous demodulation are required to extract the baseband signal information. In the preferred embodiment, RF gain is produced by a broadband three stage RF low noise amplifier 33. The first stage, a discrete cascode stage, is critical with regard to noise. The last stage is critical in that when the flux locked loop 12,14 is unlocked the amplifier must remain linear and the high noise level of the unlocked loop must not cause the amplifier to saturate and cause spectral regrowth of the RF low noise amplifier's 33 output spectrum. If re-growth occurs, the loop may not lock.

The modulation products out of the DC SQUID need only be preserved at the fundamental modulation frequency; all of the odd harmonics that comprise the flux modulation square wave need not be preserved in order to obtain a fully usable signal out of the RF mixer 35, described below. Thus, the minimum bandwidth of the RF low noise amplifier 33 must be twice the baseband bandwidth of the signals of interest because DSB-SC occupies twice the bandwidth of the baseband signal.

A single RF low noise amplifier is preferred, though multiple RF low noise amplifiers operating in parallel may also be used. The signal from the DC SQUID sensor 20 is coupled into at least one such RF low noise amplifier 33 via the DC/RF matching circuit 23 which matches the impedance of the Upper transmission line 25 to the impedance of the sensor 20. The RF low noise amplifier 33 has a bandwidth that is at least two times the loop tracking bandwidth of the flux locked loop 12,14 as a whole and is centered at the flux modulation frequency. The RF low noise amplifier 33 is constructed with readily available low noise components and, preferably, has a gain adjustment circuit for fine tuning control loop dynamics. The RF low noise amplifier 33 has a higher percentage of the total loop gain than that in the DC portion of the control loop, which benefits control loop DC stability. The RF low noise amplifier 33 feeds the RF bandpass filter 34.

Though not preferred, multiple RF low noise amplifiers operating in parallel may be used to reduce the effective amplifier input noise by the square root of the number of devices used. For example, four amplifiers in parallel results in a noise voltage reduction of 2:1.

The RF bandpass filter 34 is used to limit the noise bandwidth to twice the tracking bandwidth and to remove noise at odd harmonics of the flux modulation frequency that would otherwise mix down to baseband in the RF mixer 35 and degrade system noise performance. The RF bandpass filter 34 is preferably a single pole bandpass filter because the single pole response provides for minimum added delay through the loop.

The RF mixer 35 performs traditional synchronous demodulation using a properly phased local oscillator (LO) provided by the flux modulation source 36, described below. In the preferred embodiment, a commercial double-balanced mixer with the highest available local oscillator (LO) to intermediate frequency (IF) output isolation was selected. The RF port of the RF mixer 35 is fed the filtered output of the RF low noise amplifier 33, and the IF port of the balanced mixer 35 feeds the integrator 41 with no additional filtering. All connections to and from the RF mixer 35 are broadband matched.

The flux modulation source 36 includes a flux modulation oscillator and is operable to produce a square wave flux modulation signal. For the DC SQUID sensor 20 to operate well as a DSB-SC modulator the square wave generated by the flux modulation oscillator must be preserved, without distortion, all the way to the flux modulation coil 22. A square wave with a total rise and fall time of less than 8% of the period is sufficient for this purpose.

The flux modulation source 36 can be virtually any square wave generator that produces sharp rise and fall times. In the preferred embodiment, the flux modulation source 36 is a low cost clock module operating at a duty cycle of approximately 50%. The flux modulation signal drives the phase setting circuit 37 which causes the RF mixer 35 to be coherent with the input signal from the low noise amplifier 33 at the proper phase angle for operation of the RF mixer 35.

Figure 3:
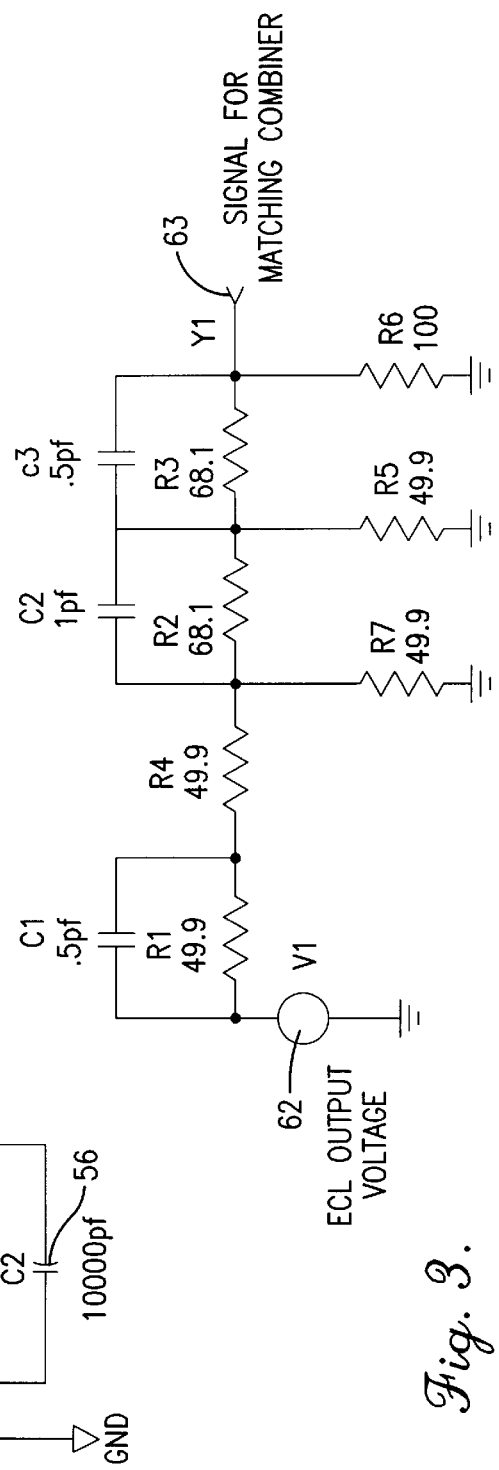
FIG. 3 is a circuit diagram illustrating a preferred embodiment of the sharpener circuit of the present invention.

Referring to FIGS. 1 and 3, a sharpener circuit 38 may be included if the flux modulation frequency is raised to very high RF frequencies. By employing readily available emitter-coupled logic (ECL) technology to obtain the fastest possible square wave, a sharpener circuit 38 consisting of a lossy passive network, may be added to sharpen the square wave edges and allow the flux modulation frequency to be increased to the highest practical value. Modern high speed ECL technology produces output voltage swings approximately 600 to 800 mV into 50 Ohms. Only a few millivolts are required at the matching combiner 40, however, to generate the required flux modulation current at the DC SQUID sensor 20. Thus, the high output level of the ECL must be attenuated before it is applied to the matching combiner 40. By taking advantage of the fact that the signal must be attenuated, and attenuating the lower frequency components more than the higher frequency components, the rise and fall times of the resulting attenuated square wave may be made faster. By sharpening the square wave, the flux modulation frequency may be pushed even higher, to frequencies approaching the toggle limit of the ECL logic (low gighertz region). Square waves of very fast rise and fall times are required to take full advantage of the read-out electronics of the copending patent application entitled "Frequency Multiplexed Flux Locked Loop Architecture for Multi-Channel DC SQUID Systems", Ser. No. 09/596,137, filed Jun. 16, 2000.

Referring to FIG. 3, a preferred embodiment of the sharpener circuit 38 is shown wherein an attenuator string is used to attenuate the ECL output voltage 62 by approximately 26 dB in order to produce an output signal 63 suitable for use by the matching combiner 40 (see FIG. 1), and the rise and fall times are improved by a factor of approximately three. The illustrated sharpener circuit 38 maintains a controlled impedance of 50 Ohms.

The preferred embodiment of the integrator 41 performs both integration and differentiation functions. The integrator 41 is comprised of two passive integrator stages, each driving a wideband gain block. This arrangement aids in maximizing the frequency response of the overall integrator 41. The second integrator stage low noise gain block provides the output of the integrator 41. This output signal is attenuated and converted into a controlled source impedance for signal summation in the matching combiner circuit 40. The output of the integrator 41 is also the usable output signal of the non-cryogenic electronics 14. A buffer amplifier 42 is used to buffer the output signal. Because this signal is the identical image of the external flux, the signal characteristics of the external flux can be measured from the buffered output signal of the integrator 41.

The matching combiner circuit 40 combines the controlled-impedance outputs of the integrator 41 and the flux modulation source 36 in a controlled-impedance matching combiner circuit. The matching combiner circuit 40 must preserve the signal fidelity of the flux modulation signal with fast rise and fall times as well as preserve the signal fidelity of the integrator output whose signal components go to DC. In DC SQUID applications, the output of the matching combiner circuit 40 is fed via the lower transmission line 26 to the low Johnson noise matching circuit 24 and flux modulation coil 22. This low noise controlled impedance technique provides a much wider bandwidth than was previously obtainable in the art.

From the preceding description, it can be seen that the flux locked loop of the present invention extends the frequency of operation of flux locked loops, thereby enabling them to better track undesired magnetic interference that is summed with the desired signals to be measured. This interference can be separated and removed from the desired signals by analog or digital signal processing of the FLL output signal, as shown in the copending patent application entitled "Read-Out Electronics for DC SQUID Magnetic Measurements", Ser. No. 09/596,190, filed Jun. 16, 2000. In applications involving DC SQUID read-out electronics, the flux locked loop of the present invention is essential to achieving practical operation in unshielded environments.

Although the invention has been described with reference to the preferred embodiment illustrated in the attached drawings, it is noted that equivalents may be employed and substitutions made herein without departing from the scope of the invention as recited in the claims. Furthermore, although described for purposes of illustration as a component of read-out electronics for a DC SQUID system, the present invention is for a flux locked loop independent of any particular application.

Having thus described the preferred embodiment of the invention, what is claimed as new and desired to be protected by Letters Patent includes the following:

1. A flux locked loop coupled to at least one external electric or magnetic sensor, the external electric or magnetic sensor exhibiting a double side band suppressed carrier characteristic, the flux locked loop being operable to receive at least one input signal from and provide feedback to the external electric or magnetic sensor, the input signal comprising a desired signal and at least one undesired signal, the flux locked loop comprising:
   at least one bias current source operable to produce bias current for injection into the external electric or magnetic sensor;
   a first amplifier operable to impedance match and to amplify the input signal received from the external electric or magnetic sensor;
   a flux modulation source operable to produce a flux modulation signal having a waveform and a flux modulation frequency and a phase and an amplitude;
   a bandpass filter operable to remove from the input signal at least one of the undesired signals;
   a mixer operable to provide synchronous demodulation of the input signal;
   an integrator operable to perform integration and differentiation on the input signal; and
   a matching combiner circuit operable to impedance match and combine the input signal with the flux modulation signal.

2. A flux locked loop coupled to at least one external electric or magnetic sensor, the external electric or magnetic sensor exhibiting a double side band suppressed carrier characteristic, the flux locked loop being operable to receive at least one input signal from and provide feedback to the external electric or magnetic sensor, the input signal comprising a desired signal and at least one undesired signal, the flux locked loop comprising:
   at least one bias current source operable to produce bias current for injection into the external electric or magnetic sensor;
   a first amplifier operable to impedance match and to amplify the input signal received from the external electric or magnetic sensor;
   a flux modulation source operable to produce a flux modulation signal having a waveform and a flux modulation frequency and a phase and an amplitude;
   a phase setting circuit operable to set the phase of the flux modulation signal;
   a bandpass filter operable to remove from the input signal at least one of the undesired signals; and
   a mixer operable to provide synchronous demodulation of the input signal;
   an integrator operable to perform integration and differentiation on the input signal.

3. A flux locked loop coupled to at least one external electric or magnetic sensor, the external electric or magnetic sensor exhibiting a double side band suppressed carrier characteristic, the flux locked loop being operable to receive at least one input signal from and provide feedback to the external electric or magnetic sensor, the input signal comprising a desired signal and at least one undesired signal, the flux locked loop comprising:
   at least one bias current source operable to produce bias current for injection into the external electric or magnetic sensor;
   a first amplifier operable to impedance match and to amplify the input signal received from the external electric or magnetic sensor;
   a flux modulation source operable to produce a flux modulation signal having a waveform and a flux modulation frequency and a phase and an amplitude;
   an amplitude setting circuit operable to preserve the waveform of the flux modulation signal and further operable to obtain a desired amplitude for the flux modulation signal;
   a bandpass filter operable to remove from the input signal at least one of the undesired signals;
   a mixer operable to provide synchronous demodulation of the input signal; and
   an integrator operable to perform integration and differentiation on the input signal.

4. A flux locked loop coupled to at least one external electric or magnetic sensor, the external electric or magnetic sensor exhibiting a double side band suppressed carrier characteristic, the flux locked loop being operable to receive at least one input signal from and provide feedback to the external electric or magnetic sensor, the input signal comprising a desired signal and at least one undesired signal, the flux locked loop comprising:
   at least one bias current source operable to produce bias current for injection into the external electric or magnetic sensor;
   a first amplifier operable to impedance match and to amplify the input signal received from the external electric or magnetic sensor;
   at least one additional amplifier connected in parallel with the first amplifier;

a flux modulation source operable to produce a flux modulation signal having a waveform and a flux modulation frequency and a phase and an amplitude;

a bandpass filter operable to remove from the input signal at least one of the undesired signals;

a mixer operable to provide synchronous demodulation of the input signal; and an integrator operable to perform integration and differentiation on the input signal.

5. A flux locked loop coupled to at least one external electric or magnetic sensor, the external electric or magnetic sensor exhibiting a double side band suppressed carrier characteristic, the flux locked loop being operable to receive at least one input signal from and provide feedback to the external electric or magnetic sensor, the input signal comprising a desired signal and at least one undesired signal, the flux locked loop comprising:

at least one bias current source operable to produce bias current for injection into the external electric or magnetic sensor;

a first amplifier operable to impedance match and to amplify the input signal received from the external electric or magnetic sensor;

a flux modulation source operable to produce a flux modulation signal having a waveform and a flux modulation frequency and a phase and an amplitude;

a sharpener circuit operable to obtain fast rise and fall times on the flux modulation signal produced by the flux modulation source;

a bandpass filter operable to remove from the input signal at least one of the undesired signals;

a mixer operable to provide synchronous demodulation of the input signal; and an integrator operable to perform integration and differentiation on the input signal.

6. A flux locked loop coupled to at least one external electric or magnetic sensor, the external electric or magnetic sensor exhibiting a double side band suppressed carrier characteristic, the flux locked loop being operable to receive at least one input signal from and provide feedback to the external electric or magnetic sensor, the input signal comprising a desired signal and at least one undesired signal, the flux locked loop comprising:

at least one bias current source operable to produce bias current for injection into the external electric or magnetic sensor;

a first amplifier operable to impedance match and to amplify the input signal received from the external electric or magnetic sensor;

a flux modulation source operable to produce a flux modulation signal having a waveform and a flux modulation frequency and a phase and an amplitude;

a bandpass filter operable to remove from the input signal at least one of the undesired signals;

a mixer operable to provide synchronous demodulation of the input signal;

an integrator operable to perform integration and differentiation on the input signal; and at least one transmission line coupling the flux locked loop to the external electric or magnetic sensor.

7. The flux locked loop of claim 6, the transmission line being coaxial cable.

8. The flux locked loop of claim 6, the transmission line being stripline.

9. The flux locked loop of claim 6, the transmission line being impedance matched at both ends.

10. The flux locked loop of claim 6, the transmission line being impedance matched at only one end.

11. The flux locked loop of claim 6, further comprising at least one impedance matching circuit operable to match the impedance of the external electric or magnetic sensor to the impedance of the transmission line and the flux locked loop.

12. A radio-frequency flux locked loop coupled to at least one direct current superconducting quantum interference device; the direct current superconducting quantum interference device being located in a cryogenic environment, the radio-frequency flux locked loop being operable to receive an input signal from and provide feedback to the direct current superconducting quantum interference device, the input signal comprising a desired signal and at least one undesired signal, the radio-frequency flux locked loop comprising:

at least one direct current bias current source operable to produce a bias current;

a controlled impedance radio-frequency bias tee operable to inject the bias current into the direct current superconducting quantum interference device;

a first radio-frequency amplifier operable to impedance match and to amplify the input signal received from the direct current superconducting quantum interference device;

a radio-frequency flux modulation source operable to produce a flux modulation signal having a flux modulation frequency and a phase and an amplitude and a waveform;

a radio-frequency bandpass filter operable to remove from the input signal at least one of the undesired signals;

a radio-frequency mixer operable to provide synchronous demodulation of the input signal; and an integrator operable to perform integration and differentiation on the input signal.

13. A radio-frequency flux locked loop coupled to at least one direct current superconducting quantum interference device; the direct current superconducting quantum interference device being located in a cryogenic environment, the radio-frequency flux locked loop being operable to receive an input signal from and provide feedback to the direct current superconducting quantum interference device, the input signal comprising a desired signal and at least one undesired signal, the radio-frequency flux locked loop comprising:

at least one direct current bias current source operable to produce bias current for injection into the direct current superconducting quantum interference device;

a first radio-frequency amplifier operable to impedance match and to amplify the input signal received from the direct current superconducting quantum interference device;

a radio-frequency flux modulation source operable to produce a flux modulation signal having a flux modulation frequency and a phase and an amplitude and a waveform;

a radio-frequency bandpass filter operable to remove from the input signal at least one of the undesired signals;

a radio-frequency mixer operable to provide synchronous demodulation of the input signal;

an integrator operable to perform integration and differentiation on the input signal; and a radio-frequency matching combiner circuit operable to impedance match and combine the input signal with the flux modulation signal.

14. A radio-frequency flux locked loop coupled to at least one direct current superconducting quantum interference device; the direct current superconducting quantum interference device being located in a cryogenic environment, the radio-frequency flux locked loop being operable to receive an input signal from and provide feedback to the direct current superconducting quantum interference device, the input signal comprising a desired signal and at least one undesired signal, the radio-frequency flux locked loop comprising:

at least one direct current bias current source operable to produce bias current for injection into the direct current superconducting quantum interference device;

a first radio-frequency amplifier operable to impedance match and to amplify the input signal received from the direct current superconducting quantum interference device;

a radio-frequency flux modulation source operable to produce a flux modulation signal having a flux modulation frequency and a phase and an amplitude and a waveform;

a radio-frequency phase setting circuit operable to adjust the phase of the flux modulation signal;

a radio-frequency bandpass filter operable to remove from the input signal at least one of the undesired signals;

a radio-frequency mixer operable to provide synchronous demodulation of the input signal; and an integrator operable to perform integration and differentiation on the input signal.

15. A radio-frequency flux locked loop coupled to at least one direct current superconducting quantum interference device; the direct current superconducting quantum interference device being located in a cryogenic environment, the radio-frequency flux locked loop being operable to receive an input signal from and provide feedback to the direct current superconducting quantum interference device, the input signal comprising a desired signal and at least one undesired signal, the radio-frequency flux locked loop comprising:

at least one direct current bias current source operable to produce bias current for injection into the direct current superconducting quantum interference device;

a first radio-frequency amplifier operable to impedance match and to amplify the input signal received from the direct current superconducting quantum interference device;

a radio-frequency flux modulation source operable to produce a flux modulation signal having a flux modulation frequency and a phase and an amplitude and a waveform;

a radio-frequency amplitude setting circuit operable to preserve the waveform of the flux modulation signal and further operable to obtain a desired amplitude for the flux modulation signal;

a radio-frequency bandpass filter operable to remove from the input signal at least one of the undesired signals;

a radio-frequency mixer operable to provide synchronous demodulation of the input signal; and an integrator operable to perform integration and differentiation on the input signal.

16. A radio-frequency flux locked loop coupled to at least one direct current superconducting quantum interference device; the direct current superconducting quantum interference device being located in a cryogenic environment, the radio-frequency flux locked loop being operable to receive an input signal from and provide feedback to the direct current superconducting quantum interference device, the input signal comprising a desired signal and at least one undesired signal, the radio-frequency flux locked loop comprising:

at least one direct current bias current source operable to produce bias current for injection into the direct current superconducting quantum interference device;

a first radio-frequency amplifier operable to impedance match and to amplify the input signal received from the direct current superconducting quantum interference device;

at least one additional radio-frequency low noise amplifier connected in parallel with the first radio-frequency low noise amplifier;

a radio-frequency flux modulation source operable to produce a flux modulation signal having a flux modulation frequency and a phase and an amplitude and a waveform;

a radio-frequency bandpass filter operable to remove from the input signal at least one of the undesired signals;

a radio-frequency mixer operable to provide synchronous demodulation of the input signal; and an integrator operable to perform integration and differentiation on the input signal.

17. A radio-frequency flux locked loop coupled to at least one direct current superconducting quantum interference device; the direct current superconducting quantum interference device being located in a cryogenic environment, the radio-frequency flux locked loop being operable to receive an input signal from and provide feedback to the direct current superconducting quantum interference device, the input signal comprising a desired signal and at least one undesired signal, the radio-frequency flux locked loop comprising:

at least one direct current bias current source operable to produce bias current for injection into the direct current superconducting quantum interference device;

a first radio-frequency amplifier operable to impedance match and to amplify the input signal received from the direct current superconducting quantum interference device;

a radio-frequency flux modulation source operable to produce a flux modulation signal having a flux modulation frequency and a phase and an amplitude and a waveform;

a sharpener circuit operable to obtain fast rise and fall times on the flux modulation signal produced by the radio-frequency flux modulation source;

a radio-frequency bandpass filter operable to remove from the input signal at least one of the undesired signals;

a radio-frequency mixer operable to provide synchronous demodulation of the input signal; and an integrator operable to perform integration and differentiation on the input signal.

18. A radio-frequency flux locked loop coupled to at least one direct current superconducting quantum interference device; the direct current superconducting quantum interference device being located in a cryogenic environment, the radio-frequency flux locked loop being operable to receive an input signal from and provide feedback to the direct current superconducting quantum interference device, the input signal comprising a desired signal and at least one undesired signal, the radio-frequency flux locked loop comprising:

at least one direct current bias current source operable to produce bias current for injection into the direct current superconducting quantum interference device;

a first radio-frequency amplifier operable to impedance match and to amplify the input signal received from the direct current superconducting quantum interference device;

a radio-frequency flux modulation source operable to produce a flux modulation signal having a flux modulation frequency and a phase and an amplitude and a waveform;

a radio-frequency bandpass filter operable to remove from the input signal at least one of the undesired signals;

a radio-frequency mixer operable to provide synchronous demodulation of the input signal; and an integrator operable to perform integration and differentiation on the input signal; and at least one transmission line coupling the radio-frequency flux locked loop to the direct current superconducting quantum interference device.

19. The radio-frequency flux locked loop of claim 18, the transmission line being radio-frequency shielded, controlled-impedance transmission lines having any characteristic impedance.

20. The radio-frequency flux locked loop of claim 18, the transmission line being coaxial cable.

21. The radio-frequency flux locked loop of claim 18, the transmission line being stripline.

22. The radio-frequency flux locked loop of claim 18, the transmission line having a characteristic impedance of 50 Ohms.

23. The radio-frequency flux locked loop of claim 18, the transmission line being impedance matched at both ends.

24. The radio-frequency flux locked loop 18, the transmission line being impedance matched at only one end.

25. The radio-frequency flux locked loop of claim 18, further comprising at least one impedance matching circuit located within the cryogenic environment and operable to match the impedance of the direct current superconducting quantum interference device to the impedance of the transmission line or the flux locked loop.

26. The radio-frequency flux locked loop of claim 25, the impedance matching circuit being a direct current radio-frequency impedance matching circuit comprising a cold transformer.

27. The radio-frequency flux locked loop of claim 26, the cold transformer being broadband and suitable for use with radio-frequency signals and operable to match the impedance of the direct current superconducting quantum interference device to the impedance of the transmission line while allowing a direct current biasing signal to pass through the cold transformer without distorting the radio-frequency impedance matching characteristics of the cold transformer.

28. The radio-frequency flux locked loop of claim 26, the cold transformer having:

a bandwidth of greater than four octaves;

an insertion loss of less than 0.1 dB;

a pitch of 20 turns per inch; and comprising one turn of quifilar wound wire; and a radio-frequency capacitor having a capacitance of 0.01 uF, the radio-frequency capacitor being located between the windings of the cold transformer.

29. The radio-frequency flux locked loop of claim 28, the cold transformer being of an unbalanced source/unbalanced load design and having a ferrite core.

30. The radio-frequency flux locked loop of claim 28, the cold transformer being of an unbalanced source/unbalanced load design implemented using stripline techniques.

* * * * *